United States Patent
Iwamoto

(10) Patent No.: US 11,273,472 B2
(45) Date of Patent: Mar. 15, 2022

(54) BOTTOM GAS PURGE UNIT, LOAD PORT APPARATUS, AND BOTTOM GAS PURGE METHOD

(71) Applicant: TDK CORPORATION, Tokyo (JP)

(72) Inventor: Tadamasa Iwamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 210 days.

(21) Appl. No.: 16/597,895

(22) Filed: Oct. 10, 2019

(65) Prior Publication Data

US 2020/0114403 A1 Apr. 16, 2020

(30) Foreign Application Priority Data

Oct. 12, 2018 (JP) .............................. JP2018-193766

(51) Int. Cl.
*B08B 9/08* (2006.01)
*B08B 5/00* (2006.01)
*H01L 21/673* (2006.01)

(52) U.S. Cl.
CPC ............... *B08B 9/08* (2013.01); *B08B 5/00* (2013.01); *H01L 21/67389* (2013.01); *B08B 2209/08* (2013.01)

(58) Field of Classification Search
CPC ......... B08B 9/08; B08B 5/00; B08B 2209/08; H01L 21/67389; H01L 21/67393
See application file for complete search history.

(56) References Cited

U.S. PATENT DOCUMENTS

2011/0214778 A1 9/2011 Natsume et al.
2014/0360531 A1* 12/2014 Fosnight .................. B08B 5/02
 134/21
2017/0025296 A1* 1/2017 Emoto ............. H01L 21/67389

FOREIGN PATENT DOCUMENTS

JP 2011-187539 A 9/2011

* cited by examiner

*Primary Examiner* — Natasha N Campbell
(74) *Attorney, Agent, or Firm* — Oliff PLC

(57) ABSTRACT

Provided is a bottom gas purge device including a nozzle that can be appropriately connected to a purge port. A bottom gas purge device configured to introduce a cleaning gas into a container from a bottom portion of the container accommodating a substrate includes: a mounting table on which the container is mounted; a nozzle provided so as to be movable relative to the mounting table in an upward-downward direction and connectable from below to a purge port provided in the bottom portion of the container; a gas supply unit configured to supply the cleaning gas to the nozzle; and a pressure sensor provided at a tip end portion of the nozzle and configured to detect a pressure rising between the purge port and the nozzle when the nozzle is connected to the purge port.

7 Claims, 7 Drawing Sheets

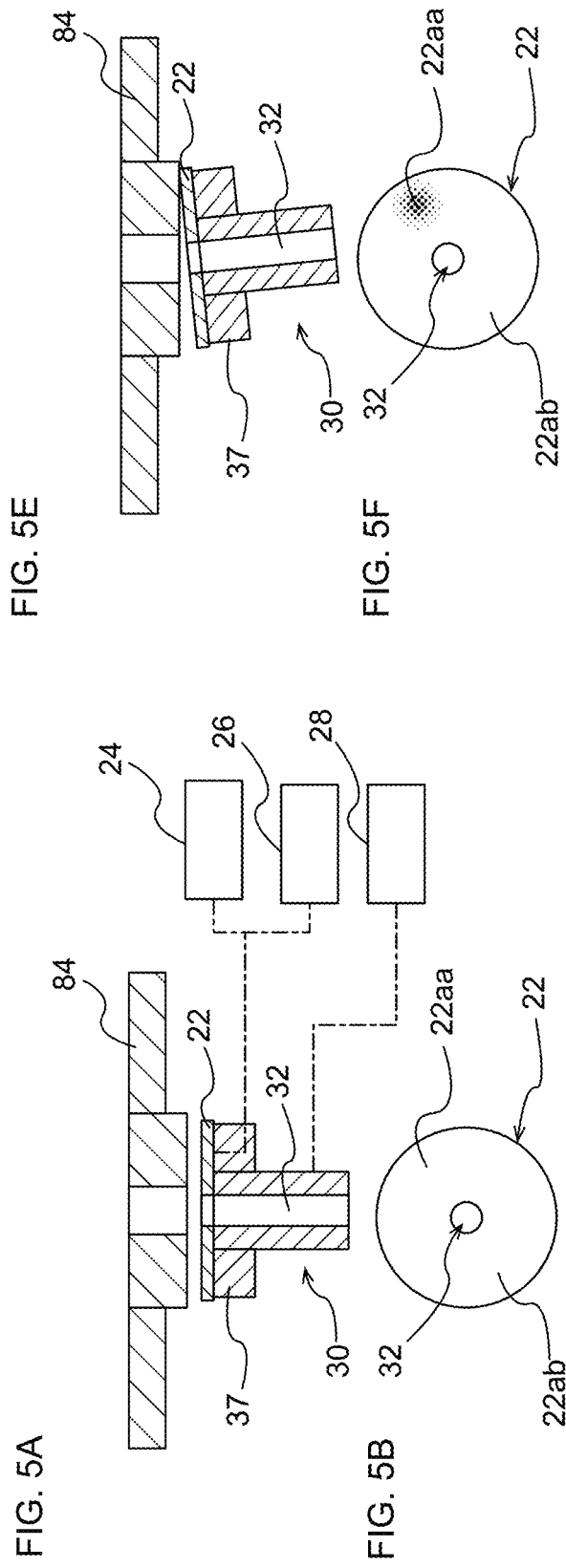
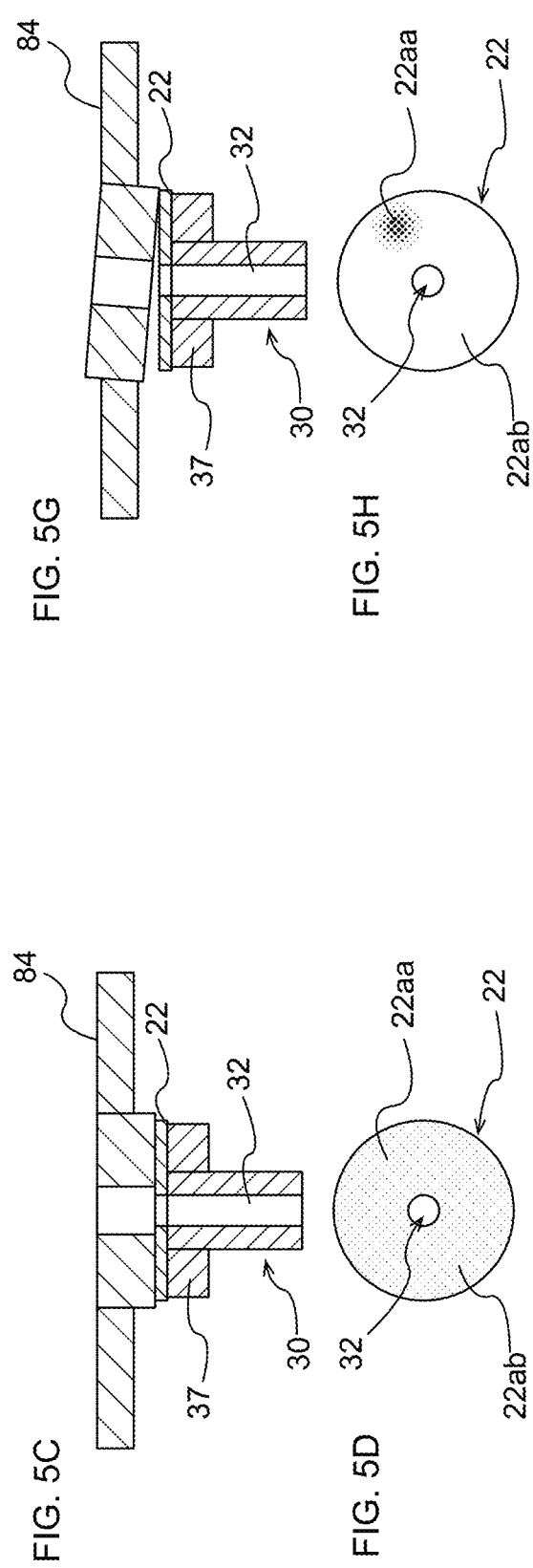

BOTTOM GAS PURGE UNIT, LOAD PORT APPARATUS, AND BOTTOM GAS PURGE METHOD

BACKGROUND OF THE INVENTION

Field of the Invention

The present invention relates to a bottom gas purge device and the like that perform gas purging from a bottom portion of the container on the container that transports a substrate.

Description of the Related Art

In a semiconductor factory or the like, a substrate is transported and stored in the factory by using a container in which the substrate such as a silicon wafer is accommodated. Although the container is sealed, cleanliness in the container may decrease due to outgas generated from the accommodated substrate and leakage or gas permeation from the sealed portion.

Accordingly, in recent years, a load port apparatus that delivers a container in a semiconductor factory has been propose to include a bottom gas purge device that performs gas purging from a bottom portion of the container. (JP-A-2011-187539) The bottom gas purge device can connect a nozzle to a purge port provided at the bottom portion of the container and introduce a cleaning gas into the container via the nozzle.

SUMMARY OF THE INVENTION

However, in the bottom gas purge device in related art, connection between the nozzle and the purge port may be insufficient, and the gas may leak from a gap between the nozzle and the purge port. In such a case, efficiency of the bottom gas purge may be lowered, and the leaked gas may excessively reduce oxygen concentration around the device in the factory. On the other hand, in order to ensure the connection between the nozzle and the purge port, pressure at which the nozzle is pressed against the purge port is also considered to be increased. However, in this case, the entire container is pushed upward by a force of pressing the nozzle against the bottom portion of the container, which causes the container to be inclined with respect to a mounting table.

In view of these circumstances, the present invention provides a bottom gas purge device including a nozzle that can be appropriately connected to a purge port.

In order to achieve the above object, a bottom gas purge device according to the present invention is configured to introduce a cleaning gas into a container from a bottom portion of the container accommodating a substrate. The bottom gas purge device includes:

a mounting table on which the container is mounted;

a nozzle provided so as to be movable relative to the mounting table in an upward-downward direction and connectable from below to a purge port provided in the bottom portion of the container;

a gas supply unit configured to supply the cleaning gas to the nozzle; and a pressure sensor provided at a tip end portion of the nozzle and configured to detect a pressure rising between the purge port and the nozzle when the nozzle is connected to the purge port.

Since the bottom gas purge device according to the present invention includes the pressure sensor provided at the tip end portion of the nozzle, the pressure at which the nozzle is connected to the purge port can be detected. Therefore, such a bottom gas purge device can connect the nozzle and the purge port at an appropriate pressure, and can prevent gas leakage due to a connection failure between the nozzle and the purge port and prevent the purge port from being pushed upward excessively strongly by the nozzle.

For example, the bottom gas purge device according to the present invention may include a normal connection detection unit that detects a normal connection between the nozzle and the purge port when the pressure detected by the pressure sensor is equal to or greater than a first predetermined value.

In such a bottom gas purge device, the connection between the nozzle and the purge port can be reliably detected, so that the gas leakage due to the connection failure between the nozzle and the purge port can be more preferably prevented.

For example, the pressure sensor may have a plurality of measurement points including a first measurement point and a second measurement point arranged in different directions with respect to a center of a flow path for the cleaning gas provided in the nozzle.

The bottom gas purge device including such a pressure sensor can detect that the nozzle is connected to the purge port in an inclined state. Therefore, in a case where the nozzle is inclined with respect to the purge port, such a bottom gas purge device can prevent bottom gas purging from being performed in the inclined state, for example, by redoing an connection operation of the nozzle. In addition, in such a bottom gas purge device, the gas can be preferably prevented from leaking from a gap between the nozzle and the purge port that are connected in the inclined state.

Also, for example, the bottom gas purge device according to the present invention may include an abnormal connection detection unit that detects an abnormal connection between the nozzle and the purge port when a difference in pressure detected at the first measurement point and the second measurement point of the pressure sensor is equal to or greater than a second predetermined value.

Such a bottom gas purge device can reliably detect a state in which the nozzle is pressed against the purge port in the inclined state. Therefore, such a bottom gas purge device can reliably prevent the gas from leaking from the gap between the nozzle and the purge port that are connected in the inclined state. In addition, when the abnormal connection is detected, the purge port can be more preferably prevented from being pushed upward excessively strongly by the nozzle by stopping the connection operation or the like.

Also, for example, a connection adjustment unit that adjusts the connection operation of the nozzle to the purge port may be provided.

For example, when such a bottom gas purge device detects that the nozzle and the purge port are not normally connected, the nozzle and the purge port can correctly connected by adjusting a pressing force, an angle and the like of the nozzle with respect to the purge port.

A load port apparatus according to the present invention includes any bottom gas purge device and a door that opens and closes a main opening of the container.

Such a load port apparatus can preferably take out and put in the substrate from and into the main opening by preventing the container from being inclined with respect to the mounting table, and can preferably prevent the gas from leaking from the gap between the nozzle and the purge port.

A bottom gas purge method according to the present invention is a bottom gas purge method for introducing a cleaning gas into a container from a bottom portion of the container accommodating a substrate. The bottom gas purge method includes:

a step of recognizing that the container is mounted on a mounting table;

a step of moving a nozzle from below toward a purge port provided at the bottom portion of the container;

a step of detecting pressure rising between the purge port and the nozzle by a pressure sensor provided at a tip end portion of the nozzle; and a step of supplying the cleaning gas to the nozzle.

According to the bottom gas purge method of the present invention, the pressure sensor provided at the tip end portion of the nozzle can detect the pressure at which the nozzle is connected to the purge port. Therefore, according to such a bottom gas purge method, the nozzle and the purge port can be connected at an appropriate pressure, and it is possible to prevent gas leakage due to a connection failure between the nozzle and the purge port and to prevent the purge port from being pushed upward excessively strongly by the nozzle during an connection operation.

BRIEF DESCRIPTION OF THE DRAWINGS

FIGS. 4A and 4B are conceptual views showing an upward-downward operation of a nozzle of the bottom gas purge device shown in FIG. 2, in which FIG. 4A shows a state in which the nozzle is in a lowered position and FIG. 4B shows a state in which the nozzle is in a raised position;

FIGS. 5A to 5H are conceptual views showing an example of pressure detection by the bottom gas purge device shown in FIG. 3;

DETAILED DESCRIPTION OF THE PREFERRED EMBODIMENTS

Figure 1:
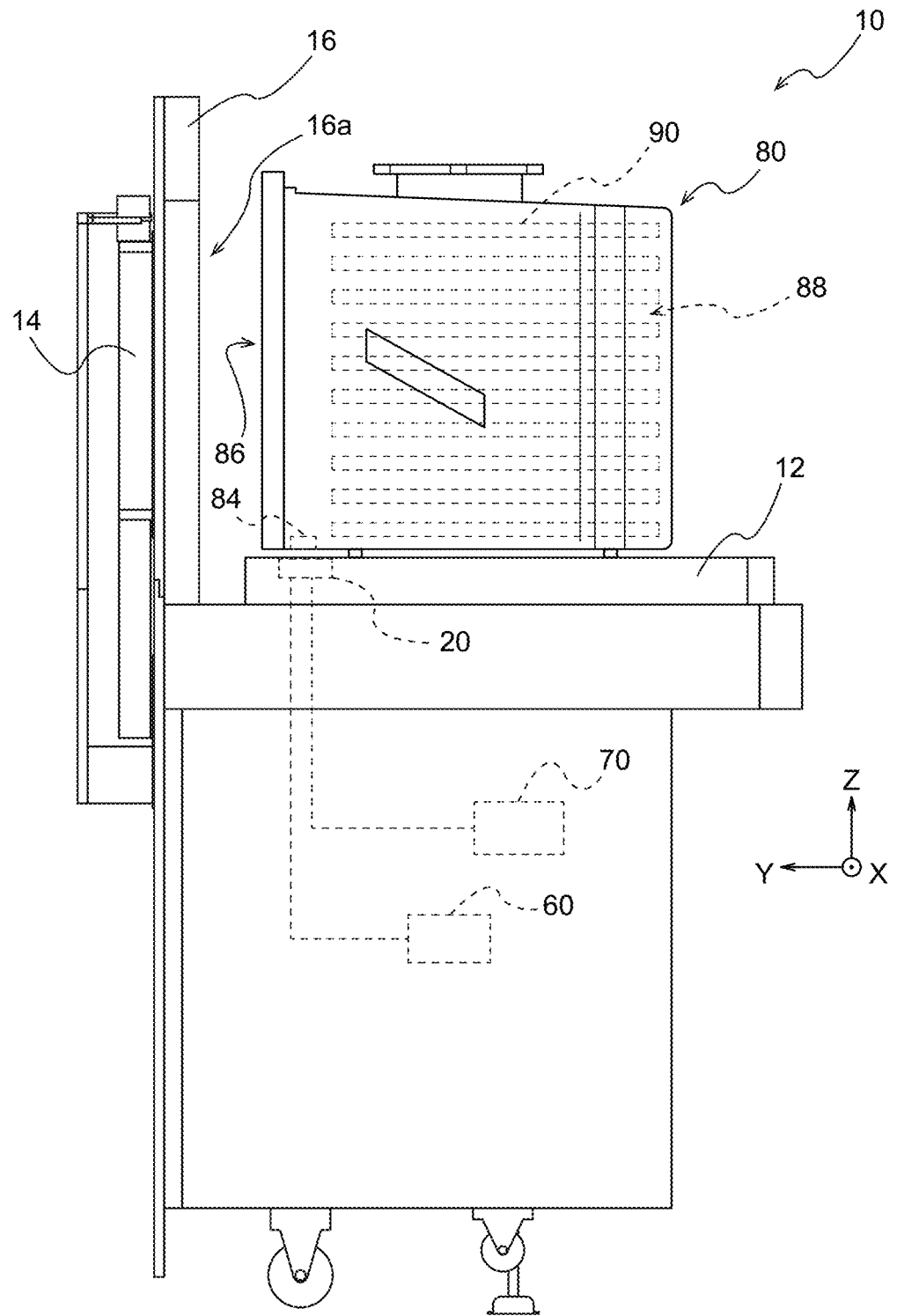
FIG. 1 is a schematic view of a load port apparatus including a bottom gas purge device according to an embodiment of the present invention and a container mounted on the load port apparatus.

Hereinafter, the present invention will be described based on an embodiment shown in the drawings.

FIG. 1 is an external view showing a load port apparatus 10 including a bottom gas purge device 20 according to an embodiment of the present invention and a FOUP 80 serving as a container mounted on a mounting table 12. The bottom gas purge device 20 is provided in, for example, the load port apparatus 10 installed in a wall portion of an EFEM, a stocker that stores the FOUP 80 or the like. However, the bottom gas purge device 20 may be provided in other devices that purge gas.

The load port apparatus 10 shown in FIG. 1 constitutes a part of the EFEM. The EFEM forms a mini-environment where a robot arm or the like for wafer transfer is provided. The robot arm takes out a substrate 90 such as a silicon wafer accommodated in the FOUP 80 from the FOUP 80 connected to the mini-environment by the load port apparatus 10, and transports the substrate 90 to a semiconductor processing device.

The load port apparatus 10 includes a door 14, a frame 16 and the like in addition to the bottom gas purge device 20 including the mounting table 12 on which the FOUP 80 is mounted. The FOUP 80 that accommodates the substrate 90 in an interior 88 and stores and transports the substrate 90 can be detachably mounted on the mounting table 12. The mounting table 12 includes a moving table or the like that moves in a Y-axis direction with the FOUP 80 mounted on an upper portion, and a main opening 86 of the FOUP 80 can be connected to a frame opening 16a of the frame 16. In the drawings, a Y axis indicates a moving direction of the mounting table 12, a Z axis indicates an upward-downward direction in a vertical direction, and an X axis indicates a direction perpendicular to the Y axis and the Z axis.

The frame 16 of the load port apparatus 10 extends upward (in a Z-axis positive direction) from the mounting table 12. The mounting table 12 and the FOUP 80 installed on the mounting table 12 move so as to be closer to and away from the frame 16. The frame opening 16a is formed in the frame 16 so as to face the main opening 86 of the FOUP 80, and the frame opening 16a is opened and closed by the door 14.

The door 14 of the load port apparatus 10 opens and closes the frame opening 16a, and engages with a lid portion detachably provided in the main opening 86 of the FOUP 80, thereby opening and closing the main opening 86. In the load port apparatus 10, after the mounting table 12 moves the FOUP 80 to a position where the FOUP 80 contacts the frame 16, the door 14 engages with the lid portion of the FOUP 80 and pulls the FOUP 80 into the mini-environment, whereby the interior 88 of the FOUP 80 and the mini-environment can be connected via the main opening 86 of the FOUP 80.

Figure 2:
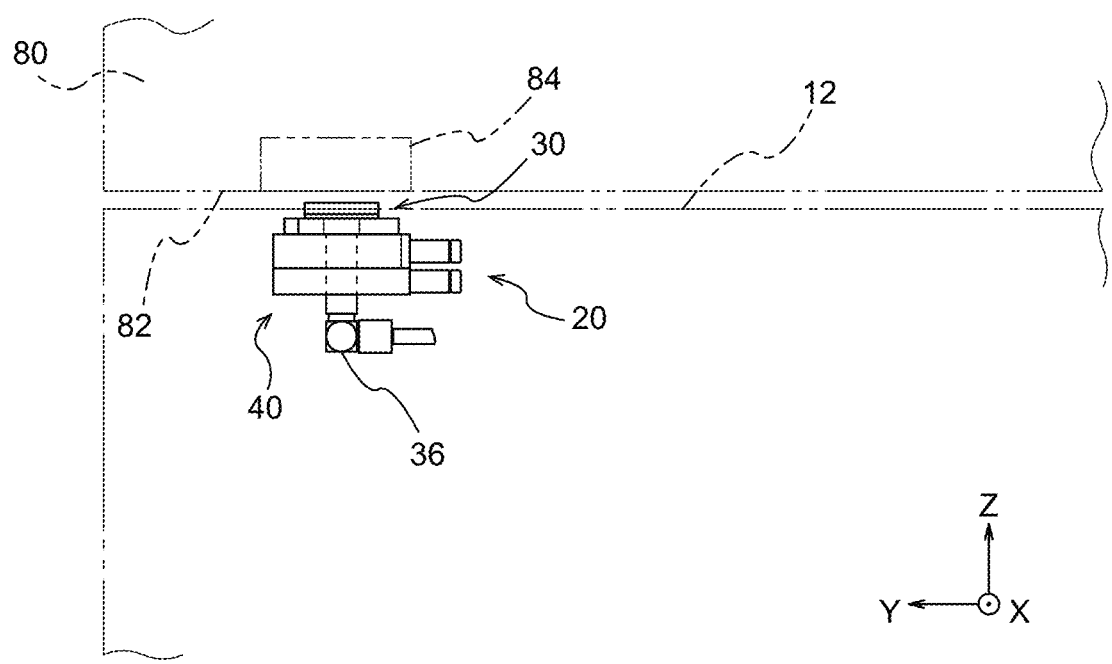
FIG. 2 is a partially enlarged view showing one arrangement of the bottom gas purge device of the load port apparatus.

As shown in FIGS. 1 and 2, the bottom gas purge device 20 in the load port apparatus 10 includes the mounting table 12 and a nozzle 30 (see FIG. 2) provided in the mounting table 12. As shown in FIG. 2, the bottom gas purge device 20 introduces a cleaning gas into the interior 88 of the FOUP 80 from a bottom portion 82 of the FOUP 80 mounted on the mounting table 12. Although only one nozzle 30 of the bottom gas purge device 20 of the load port apparatus 10 is displayed in FIG. 1, the load port apparatus 10 may include a plurality of nozzles 30.

The bottom gas purge device 20 includes the mounting table 12, a gas supply unit 60 that supplies the cleaning gas to a flow path 32 (see FIG. 5) of the nozzle 30 and the like, in addition to the nozzle 30, a base portion 40 and a pressure sensor 22 described below. Also, a control unit 70 of the load port apparatus 10 shown in FIG. 1 also serves as a control unit of the bottom gas purge device 20 and controls the mounting table 12, the gas supply unit 60, the door 14 and the like. The gas supply unit 60 includes a valve or the like that switches between supply and stop of supply of the cleaning gas to the flow path 32 of the nozzle 30. The control unit 70 includes a processor that performs arithmetic processing for controlling each unit.

FIG. 2 is a conceptual view showing an arrangement of the nozzle 30 and the base portion 40 in the bottom gas purge device 20. The nozzle 30 and the base portion 40 of the bottom gas purge device 20 are arranged so as to face a purge port 84 provided in the bottom portion 82 of the FOUP 80. As shown in FIG. 2, a gap is formed between the purge port 84 provided in the bottom portion 82 of the FOUP 80 and the mounting table 12.

Figure 3:
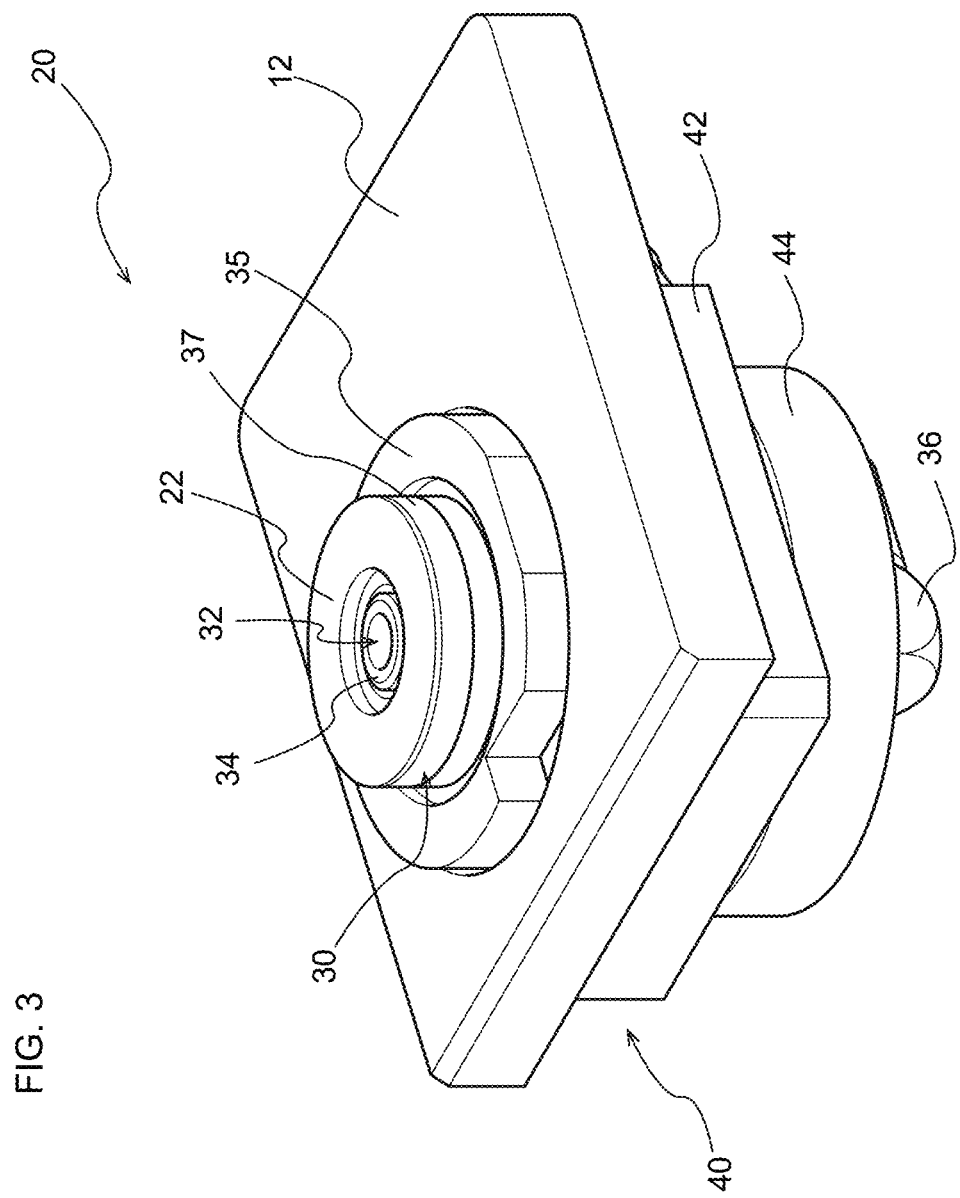
FIG. 3 is a perspective view of the bottom gas purge device shown in FIG. 2.

FIG. 3 is a perspective view showing a state in which the nozzle 30 and the base portion 40 shown in FIG. 2 and the pressure sensor 22 provided at a tip end portion 37 of the nozzle 30 are attached to the mounting table 12. The nozzle 30 and the pressure sensor 22 are provided so as to be movable relative to the mounting table 12 in the upward-downward direction. Also, the base portion 40 is fixed to the mounting table 12, and supports the nozzle 30 so as to enable relative movement.

Figure 4A:
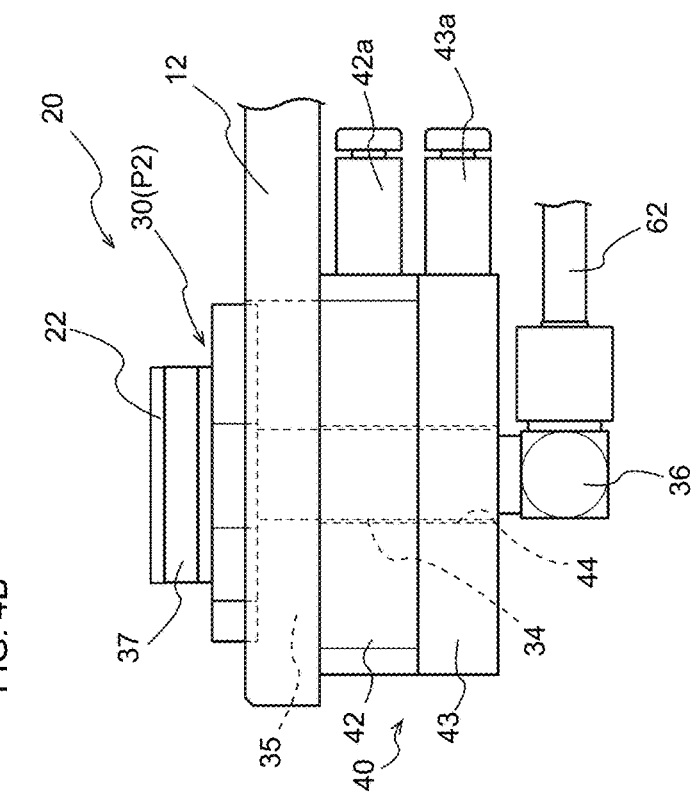
Figure 4B:
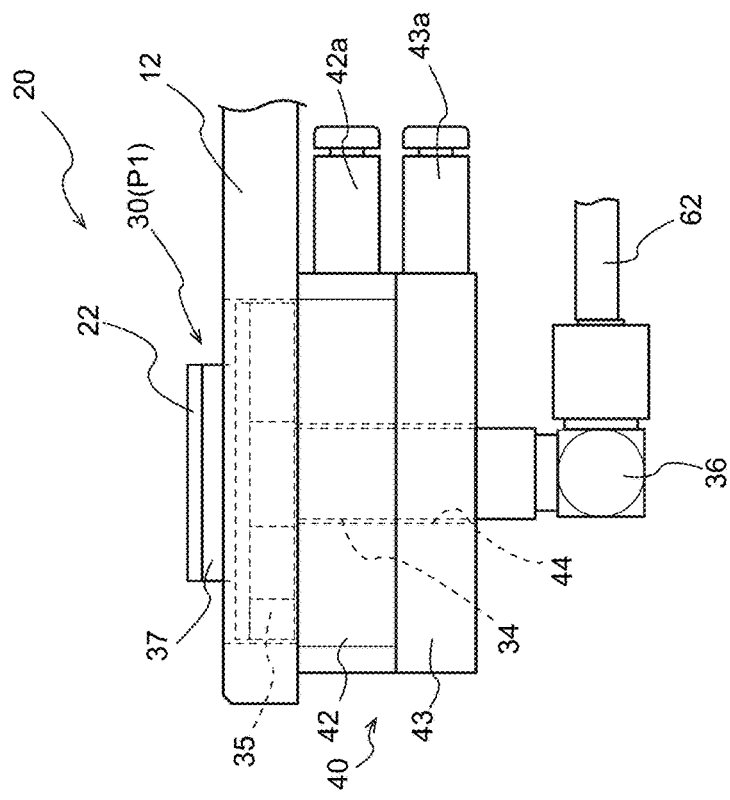

FIG. 4A shows a state in which the nozzle 30 of the bottom gas purge device 20 is in a lowered position P1, and FIG. 4B shows a state in which the nozzle 30 of the bottom gas purge device 20 is in a raised position P2. The nozzle 30 is moved from the lowered position P1 shown in FIG. 4A to the raised position (P2) shown in FIG. 4B, thereby connecting the nozzle 30 from below to the purge port 84 provided in the bottom portion 82 of the FOUP 80 as shown in FIG. 2. Thereby, the bottom gas purge device 20 can introduce the cleaning gas into the interior 88 (see FIG. 1) of the FOUP 80 via the nozzle 30 and the purge port 84.

As shown in FIGS. 4A and 4B, the nozzle 30 includes a hollow cylindrical portion 34 in which the flow path 32 is formed, and a nozzle flange portion 35 protruding from the hollow cylindrical portion 34 in an outer diameter direction. The nozzle flange portion 35 is connected to an upper portion of the hollow cylindrical portion 34. As shown in FIGS. 4A and 4B, the nozzle flange portion 35 is exposed upward from a base opening 44 of the base portion 40 through which the hollow cylindrical portion 34 is inserted. As shown in FIGS. 4A and 4B and FIG. 3, the nozzle 30 and the nozzle flange portion 35 are ring-shaped when viewed from a Z-axis direction. However, shapes of the hollow cylindrical portion 34 and the nozzle flange portion 35 are not limited to a cylindrical shape and a ring shape.

As shown in FIG. 3 and FIG. 4B, the ring-shaped tip end portion 37 is provided on an upper surface of the nozzle flange portion 35. The tip end portion 37 is provided with the pressure sensor 22 for pressure detection. The tip end portion 37 is preferably made of a resilient material such as resin, and improves airtightness of a connection portion between the flow path 32 and the purge port 84, and prevents a fluid flowing through the flow path 32 of the nozzle 30 and the purge port 84 from flowing out. Moreover, a shape of the tip end portion 37 is not limited to a ring shape, and may be formed separately from the nozzle flange portion 35, or may be formed integrally with the nozzle flange portion 35 and the hollow cylindrical portion 34 of the same material.

As shown in FIGS. 4A and 4B, a joint portion 36 is attached to a lower end of the hollow cylindrical portion 34. A gas supply flow path connected to the flow path 32 in the hollow cylindrical portion 34 is formed inside the joint portion 36. A connection path 62 of the gas supply unit 60 is connected to the joint portion 36. The cleaning gas is supplied to the flow path 32 of the hollow cylindrical portion 34 from the connection path 62 of the gas supply unit 60 connected via the joint portion 36.

As shown in FIGS. 4A and 4B, the base portion 40 supports the nozzle 30 so as to enable relative movement such that the nozzle 30 can move in the upward-downward direction between the lowered position P1 and the raised position P2. The base portion 40 is configured by combining two members, i.e., an upper base portion 42 and a lower base portion 43 in the upward-downward direction.

The base opening 44 through which the hollow cylindrical portion 34 of the nozzle 30 is inserted in the upward-downward direction is formed in the base portion 40. The base opening 44 is a through hole penetrating the base portion 40 in upward-downward direction. An opening shape of the base opening 44 is circular, and an inner diameter of the base opening 44 is substantially the same as or slightly larger than an outer diameter of the hollow cylindrical portion 34. Therefore, the hollow cylindrical portion 34 can slide inside the base opening 44 and move smoothly in the upward-downward direction.

Also, since an opening diameter of the base opening 44 is smaller than the outer diameter of the nozzle flange portion 35, the nozzle 30 is prevented from falling off downward in the bottom gas purge device 20.

As shown in FIGS. 4A and 4B, a pressure chamber that transmits power to the nozzle 30 is formed inside the base portion 40, and a first connection portion 42a and a second connection portion 43a that transmit pressure to the pressure chamber inside the base portion 40 are respectively formed in the upper base portion 42 and the lower base portion 43. The base portion 40 and the nozzle 30 are in a relationship of a cylinder and a piston. The pressure can be transmitted from the first connection portion 42a and the second connection portion 43a to the pressure chamber in the base portion 40, whereby the nozzle 30 can be moved in the upward-downward direction. In the drawings, a pipe that transmits the pressure to the first connection portion 42a and the second connection portion 43a is not shown. Also, pressure transmission to the pressure chamber of the nozzle 30 is controlled by the control unit 70 shown in FIG. 1.

FIGS. 5A to 5H are conceptual views showing a positional relationship between the nozzle 30, the pressure sensor 22 or the like of the bottom gas purge device 20 and the purge port 84 of the FOUP 80, and a pressure detection state of the pressure sensor 22. FIG. 5A shows a positional relationship of the pressure sensor 22 and the like when the nozzle 30 is in the lowered position (P1), and FIG. 5B is a conceptual view showing the pressure detection state of the pressure sensor 22 in a state shown in FIG. 5A.

As shown in FIG. 5A, the pressure sensor 22 is fixed to the tip end portion 37 of the nozzle 30 and moves together with the nozzle 30 in the upward-downward direction. FIG. 5C shows a positional relationship of the pressure sensor 22 and the like when the nozzle 30 is in the raised position (P2). As shown in FIG. 5C, the pressure sensor 22 is sandwiched between the purge port 84 and the nozzle 30 when the nozzle 30 is connected to the purge port 84. The pressure sensor 22 detects the pressure rising between the purge port 84 and the nozzle 30.

Examples of the pressure sensor 22 include a sensor that detects deformation of a diaphragm due to pressure as a change in capacitance, and a sensor that detects pressure as a change in resistance value between electrodes, but are not particularly limited as long as the pressure at which the nozzle 30 is pressed against the purge port 84 can be detected. Also, the pressure sensor 22 may merely detect whether the pressure has exceeded a predetermined pressure, and may be capable of quantitatively measuring the pressure, but is more preferably capable of quantitatively measuring the pressure.

Also, the pressure sensor 22 of the bottom gas purge device 20 according to the embodiment includes a surface pressure sensor having a plurality of measurement points 22a. As shown in FIG. 6A serving as an enlarged view of the pressure sensor 22, the pressure sensor 22 has a large number of measurement points 22a arranged on a matrix in a planar direction, and the measurement points 22a are arranged so as to surround the flow path 32 when viewed from the Z-axis direction. Therefore, the pressure sensor 22 can detect the pressure at which the nozzle 30 is pressed against the purge port 84, and at the same time, can detect an abnormal connection (see FIGS. 5E to 5H) in which the nozzle 30 is obliquely connected to the purge port 84.

A pressure sensor capable of detecting the abnormal connection in which the nozzle 30 is obliquely connected to the purge port 84 is not limited to the surface pressure sensor such as the pressure sensor 22 shown in FIG. 5A. For example, a pressure sensor 122 according to a first modification shown in FIG. 6B has a plurality of (two) measurement points including a first measurement point 122a and a second measurement point 122b arranged in different directions with respect to the flow path 32 for the cleaning gas provided in the nozzle 30.

Figure 6C:
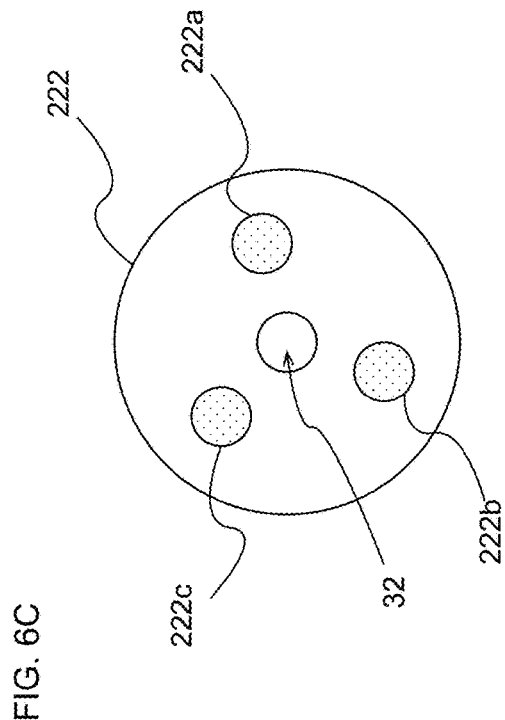
FIGS. 6A to 6D are conceptual views showing a pressure sensor of the bottom gas purge device shown in FIG. 3 and a pressure sensor according to a modification.

Also, a pressure sensor 222 according to a second modification shown in FIG. 6C has three measurement points including a first measurement point 222a, a second measurement point 222b and a third measurement point 222c arranged in different directions with respect to the flow path 32. Also, a pressure sensor 322 according to a third modification shown in FIG. 6D has four measurement points including a first measurement point 322a, a second measurement point 322b, a third measurement point 322c and a fourth measurement point 322d arranged in different directions with respect to the flow path 32.

Figure 6D:
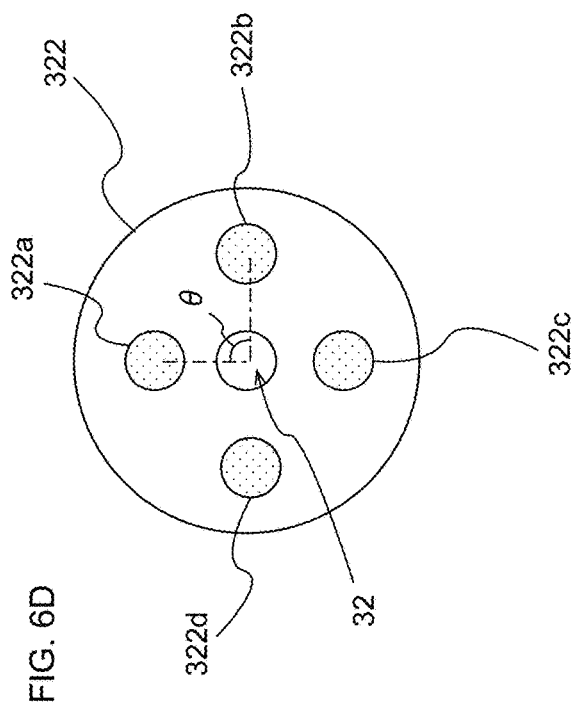
Figure 6A:
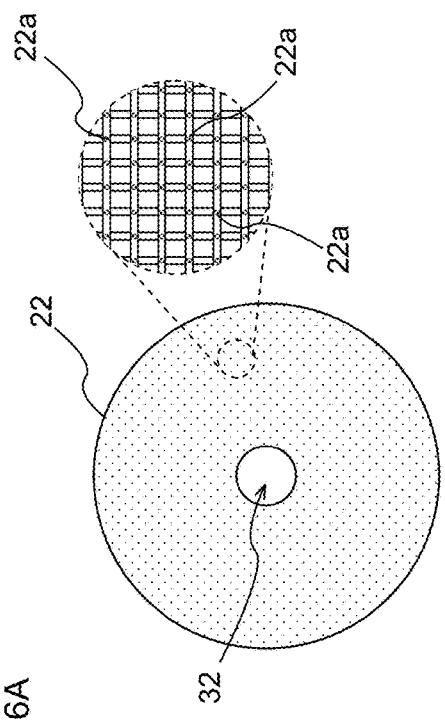
Figure 6B:
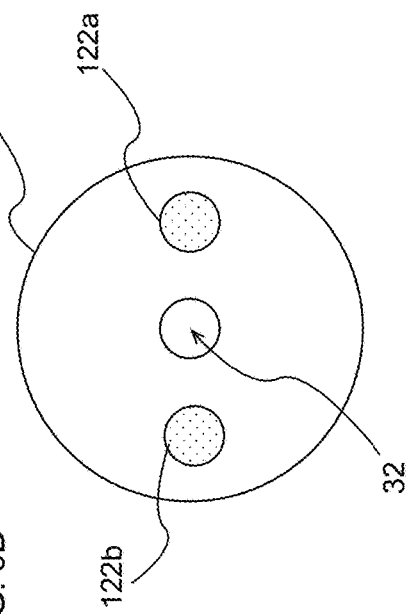

Even when pressure sensors 122, 222, 322 shown in FIGS. 6B to 6D are used in the bottom gas purge device 20 instead of the pressure sensor 22 shown in FIG. 6A, the abnormal connection in which the nozzle 30 is obliquely connected to the purge port 84 can be detected. Also, for example, in the pressure sensor 322 according to the third modification shown in FIG. 6D, an angle formed by line segments connecting a center of the flow path 32 and the first measurement point 322a and the second measurement point 322b is 90 degrees, and the angle is preferably 45 degrees or more, for example, from the viewpoint of detecting the abnormal connection in which the nozzle 30 is obliquely connected to the purge port 84.

As shown in FIG. 5A, a signal related to the pressure detected by the pressure sensor 22 is input to a normal connection detection unit 24 and an abnormal connection detection unit 26. When the pressure detected by the pressure sensor 22 is equal to or larger than a first predetermined value, the normal connection detection unit 24 detects a normal connection between the nozzle 30 and the purge port 84.

Figure 7:
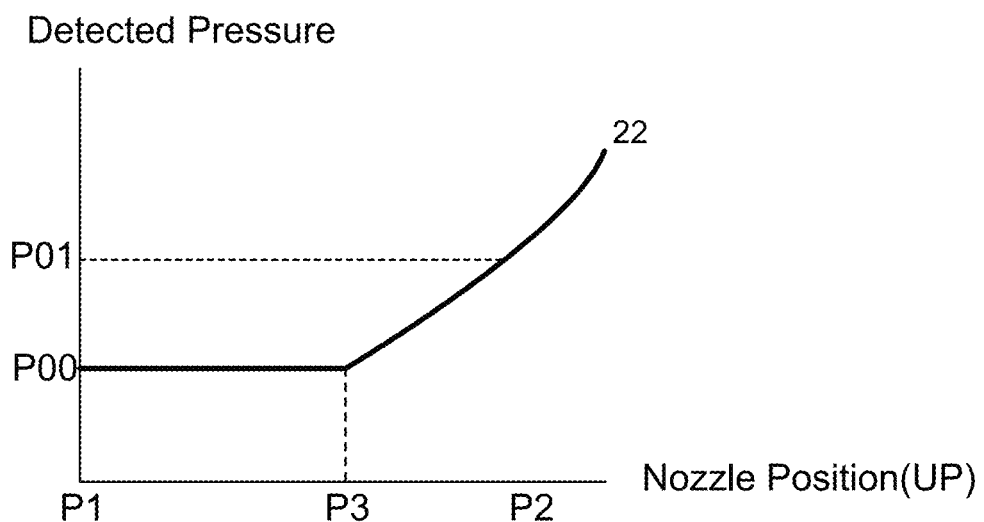
FIG. 7 is a graph showing a detection operation by a normal connection detection unit of the bottom gas purge device shown in FIG. 5.

FIG. 7 is a graph showing a normal connection detection operation by the normal connection detection unit 24 shown in FIG. 5A. When the nozzle 30 in the lowered position (P1) (see FIG. 5A) is raised toward the purge port 84, the pressure detected by the pressure sensor 22 remains at an initial pressure P00 up to a position P3 where the tip end portion 37 of the nozzle 30 or the pressure sensor 22 contacts the purge port 84. However, when the nozzle 30 moves further upward from the position P3, the pressure detected by the pressure sensor 22 rises as shown in FIG. 7.

For example, when the pressure detected by the pressure sensor 22 exceeds a first predetermined value P01 shown in FIG. 7, the normal connection detection unit 24 detects the normal connection between the nozzle 30 and the purge port 84. In a case where the pressure sensor 22 has a plurality of measurement points 22a, the normal connection detection unit 24 may detect the normal connection when an average value of the pressure of each measurement point 22a exceeds the first predetermined value P01 or when the pressure of a predetermined number of measurement points 22a exceeds the first predetermined value P01. Also, when the pressure detected by the pressure sensor 22 falls within a predetermined range, the normal connection detection unit 24 may detect the normal connection between the nozzle 30 and the purge port 84.

Figure 8:
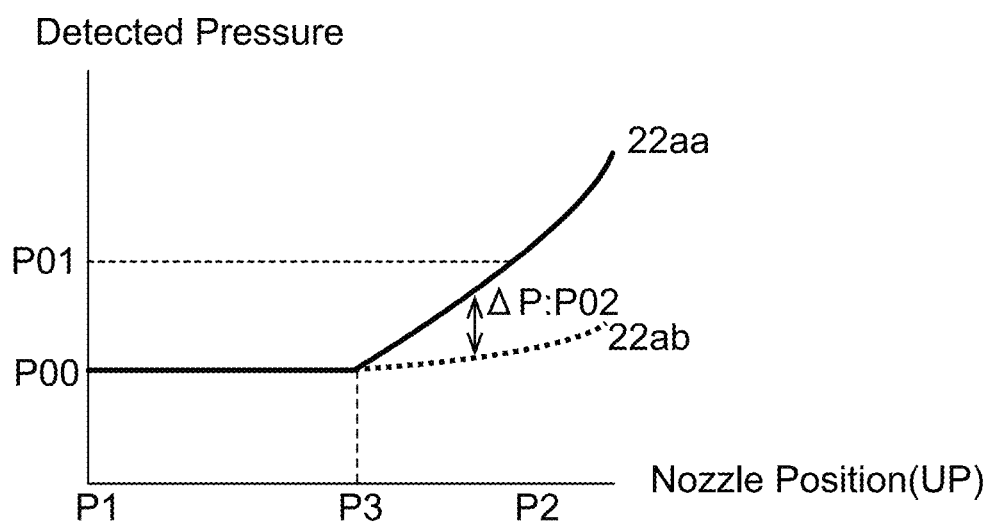
FIG. 8 is a graph showing a detection operation by an abnormal connection detection unit of the bottom gas purge device shown in FIG. 5.

FIG. 8 is a graph showing an abnormal connection detection operation by the abnormal connection detection unit 26 shown in FIG. 5A. When the nozzle 30 in the lowered position (P1) (see FIG. 5A) is raised toward the purge port 84, the pressure detected at a first measurement point 22aa and a second measurement point 22ab of the pressure sensor 22 shown in FIG. 5B remains at the initial pressure P00 up to the position P3 where the tip end portion 37 of the nozzle 30 or the pressure sensor 22 contacts the purge port 84. However, when the nozzle 30 moves further upward from the position P3, the pressure detected at the first measurement point 22aa and the second measurement point 22ab of the pressure sensor 22 rises as shown in FIG. 8.

That is, as shown in FIG. 5C, when the nozzle 30 is not inclined with respect to the purge port 84 and the nozzle 30 is pressed against the purge port 84 in a correct posture, the pressure detected by the pressure sensor 22 is uniform along an outer circumferential direction of the flow path 32, as shown in FIG. 5D. In this case, a difference ΔP in pressure detected at the first measurement point 22aa and the second measurement point 22ab is small, and the abnormal connection detection unit 26 does not detect the abnormality detection. In FIGS. 5D, 5F, 5H, height of the pressure detected at each part of the pressure sensor 22 is indicated by color density.

On the other hand, when the nozzle 30 is inclined as shown in FIG. 5E or the purge port 84 is inclined as shown in FIG. 5G, the tip end portion 37 of the nozzle 30 or the pressure sensor 22 obliquely contacts the purge port 84. In this case, as shown in FIGS. 5F, 5H, the difference in pressure detected at the first measurement point 22aa and the second measurement point 22ab is large. As shown in FIG. 8, when the difference ΔP in pressure detected at the first measurement point 22aa and the second measurement point 22ab is equal to or larger than a second predetermined value P02, the abnormal connection detection unit 26 detects the abnormal connection between the nozzle 30 and the purge port 84.

The detection results of the normal connection detection unit 24 and the abnormal connection detection unit 26 shown in FIG. 5A are transmitted to the control unit 70 shown in FIG. 1. The normal connection detection unit 24 and the abnormal connection detection unit 26 may be a processor or the like provided separately from the control unit 70, and the control unit 70 may also serve as the normal connection detection unit 24 and the abnormal connection detection unit 26.

In the bottom gas purge device 20 shown in FIGS. 1 and 2, bottom purging for introducing the cleaning gas into the interior 88 of the FOUP 80 from the bottom portion 82 of the FOUP 80 is performed in the following procedure for example. That is, in a first step, the bottom gas purge device 20 recognizes that the FOUP 80 has been mounted on the mounting table 12. The FOUP 80 is mounted by, for example, sending a detection result of the FOUP 80 by a mounting sensor (not shown) to the control unit 70. At this time, the nozzle 30 of the bottom gas purge device 20 is located at the lowered position P1 shown in FIG. 4A.

Next, in a second step, as shown in FIG. 2, the nozzle 30 of the bottom gas purge device 20 moves upward from below toward the purge port 84 provided in the bottom portion 82 of the FOUP 80 mounted on the mounting table 12. Further, in a third step started in parallel with the second step, as shown in FIGS. 5C to 5H, the pressure sensor 22 provided in the tip end portion 37 of the nozzle 30 detects the pressure rising between the purge port 84 and the nozzle 30. At this time, the nozzle 30 of the bottom gas purge device 20 is located at the raised position P2 shown in FIG. 4B.

In the third step, when the pressure detected by the pressure sensor 22 is equal to or larger than the first predetermined value P01 as shown in FIG. 7, the bottom gas purge device 20 detects the normal connection between the nozzle 30 and the purge port 84, and proceeds to a normal gas introduction operation (a fifth step) described below. On the other hand, in the third step, when the pressure detected by the pressure sensor 22 does not reach the first predetermined value, or when the difference ΔP in pressure detected at the first measurement point 22aa and the second measurement point 22ab in the pressure sensor 22 is equal to or greater than the second predetermined value P02 as shown in FIG. 8, the bottom gas purge device 20 detects a connection failure between the nozzle 30 and the purge port 84.

When the bottom gas purge device 20 detects the connection failure in the third step, the bottom gas purge device 20 moves the nozzle 30 to the lowered position P1 (a fourth step). Further, the bottom gas purge device 20 can perform the second and third steps of raising the nozzle 30 again. The bottom gas purge device 20 can repeat the operation of the nozzle 30 in the upward-downward direction in the second to fourth steps until the normal connection between the nozzle 30 and the purge port 84 is detected in the third step or an error related to time over is detected.

Also, the bottom gas purge device 20 may include a connection adjustment unit 28 (see FIG. 5A) that adjusts a connection operation of the nozzle 30 to the purge port. When bottom gas purge device 20 detects the connection failure in the third step, the connection adjustment unit 28 adjusts a pressing force, an angle and the like of the nozzle 30 with respect to the purge port 84 in the fourth step. The bottom gas purge device 20 can increase a possibility that the nozzle 30 and the purge port 84 are normally connected when the second step of raising the nozzle 30 is performed again after performing the fourth step. The connection adjustment unit 28 includes a structure that adjusts a position, an angle, a movement amount and the like of the nozzle 30, but the present invention is not limited thereto.

After the bottom gas purge device 20 detects the normal connection between the nozzle 30 and the purge port 84 in the third step, the control unit 70 shown in FIG. 1 supplies the cleaning gas to the nozzle 30, and the cleaning gas is introduced into the interior 88 of the FOUP 80 via the purge port 84 (the fifth step). In this way, the bottom gas purge device 20 can perform the bottom purging on the FOUP 80.

As described above, the bottom gas purge device 20 can detect that the pressure sensor 22 provided at the tip end portion 37 of the nozzle 30 is connected to the nozzle 30 and the purge port 84 at an appropriate pressure. Therefore, the bottom gas purge device 20 can prevent gas leakage due to the connection failure between the nozzle 30 and the purge port 84.

In addition, the bottom gas purge device 20 can prevent the pressure at which the nozzle 30 is pressed against the purge port 84 from being excessively large by performing an operation such as stopping a rise of the nozzle 30 when the pressure detected by the pressure sensor 22 reaches the first predetermined value P01. Thereby, the bottom gas purge device 20 can prevent the mounted FOUP 80 from being inclined when the nozzle 30 strongly pushes the purge port 84 upward, and prevent the connection portion between the nozzle 30 and the purge port 84 from being damaged. The load port apparatus 10 including the bottom purge device 20 can smoothly transport out the substrate from the FOUP 80 by the robot arm or the like by preventing the FOUP 80 from being inclined by the nozzle 30.

Also, since the bottom gas purge device 20 includes the pressure sensor 22 such as a surface sensor having the plurality of measurement points 22a, the bottom gas purge device 20 can detect that the nozzle 30 is connected to the purge port 84 in an inclined state. Therefore, the bottom gas purge device 20 can preferably prevent gas leakage from the gap between the nozzle and the purge port that are connected in the inclined state.

The bottom gas purge device 20 described in the embodiment and the modifications is merely an example of the device included in the technical scope of the present invention, and the present invention naturally include other embodiments and modifications. For example, the bottom gas purge device 20 may include a discharge nozzle that is connected to the purge port 84 of the FOUP 80 and exhausts the gas from the interior 88 of the FOUP 80, in addition to the nozzle 30 that introduces the cleaning gas. In this case, a pressure sensor that detects contact pressure with the bottom purge port is preferably installed at the tip end portion of the discharge nozzle as well, and, for example, a pressure sensor 22 similar to that of the nozzle 30 that introduces the cleaning gas can be installed at the discharge nozzle.

In addition, although the pressure sensor 22 contacts the purge port 84 in the bottom purge device 20 according to the embodiment as shown in FIG. 5C, the pressure sensor 22 may not directly contact the purge port 84 by arranging the pressure sensor 22 inside the tip end portion 37 or by sandwiching the pressure sensor 22 between the tip end portion 37 and the nozzle flange portion 35.

DESCRIPTION OF THE REFERENCE NUMERALS 10 load port apparatus
12 mounting table
14 door
16 frame
16a frame opening
20 bottom gas purge device
22 pressure sensor
22a measurement point
22aa, 122a, 222a, 322a first measurement point
22ab, 122b, 222b, 322b second measurement point
222c, 322c third measurement point
322d fourth measurement point
24 normal connection detection unit
26 abnormal connection detection unit
28 connection adjustment unit
30 nozzle
32 flow path
34 hollow cylindrical portion
35 nozzle flange portion
36 joint portion
37 tip end portion
P1 lowered position
P2 raised position
40 base portion 42 upper base portion
42a first connection portion
43 lower base portion
43a second connection portion
44 base opening
60 gas supply unit
62 connection path
70 control unit
80 FOUP
82 bottom portion
84 purge port
86 main opening
88 interior
90 substrate

What is claimed is:

1. A bottom gas purge device configured to introduce a cleaning gas into a container from a bottom portion of the container accommodating a substrate, the bottom gas purge device comprising:
   a mounting table on which the container is mounted;
   a nozzle provided so as to be movable relative to the mounting table in an upward-downward direction and connectable from below to a purge port provided in the bottom portion of the container;
   a gas supply unit configured to supply the cleaning gas to the nozzle; and
   a pressure sensor provided at a tip end portion of the nozzle and configured to detect a pressure rising between the purge port and the nozzle when the nozzle is connected to the purge port.

2. The bottom gas purge device according to claim 1, further comprising:
   a normal connection detection unit configured to detect a normal connection between the nozzle and the purge port when the pressure detected by the pressure sensor is equal to or greater than a first predetermined value.

3. The bottom gas purge device according to claim 1, wherein
   the pressure sensor has a plurality of measurement points including a first measurement point and a second measurement point arranged in different directions with respect to a center of a flow path for the cleaning gas provided in the nozzle.

4. The bottom gas purge device according to claim 3, further comprising:
   an abnormal connection detection unit configured to detect an abnormal connection between the nozzle and the purge port when a difference in pressure detected at the first measurement point and the second measurement point of the pressure sensor is equal to or greater than a second predetermined value.

5. The bottom gas purge device according to claim 1, wherein the nozzle is configured such that a position, an angle, and/or a movement amount of the nozzle relative to the purge port can be adjusted.

6. A load port apparatus comprising:
   the bottom gas purge device according to claim 1; and
   a door configured to open and close a main opening of the container.

7. A bottom gas purge method for introducing a cleaning gas into a container from a bottom portion of the container accommodating a substrate, the bottom gas purge method comprising the steps of:
   recognizing that the container is mounted on a mounting table;
   moving a nozzle from below toward a purge port provided at the bottom portion of the container;
   detecting a pressure rising between the purge port and the nozzle by a pressure sensor provided at a tip end portion of the nozzle; and
   supplying the cleaning gas to the nozzle.

* * * * *